United States Patent [19]
Miura et al.

[11] Patent Number: 4,757,364
[45] Date of Patent: Jul. 12, 1988

[54] LIGHT EMITTING ELEMENT

[75] Inventors: Akira Miura, Toride; Koichi Mizushima, Kamakura; Keijiro Hirahara, Tokyo; Nobuhiro Gemma, Yokohama; Taiji Furuno, Niiza; Hiroyuki Sasabe, Tokyo, all of Japan

[73] Assignee: Kabushiki Kaisha Toshiba, Kawasaki, Japan

[21] Appl. No.: 795,161

[22] Filed: Nov. 5, 1985

[30] Foreign Application Priority Data

Mar. 26, 1985 [JP] Japan .................. 60-59460

[51] Int. Cl.⁴ .................. H01L 29/78; H01L 33/00
[52] U.S. Cl. .................. 357/23.15; 357/17
[58] Field of Search .................. 264/298; 357/23.15, 357/17

[56] References Cited
FOREIGN PATENT DOCUMENTS
52-35587  8/1976  Japan .
1572181   7/1980  United Kingdom .

OTHER PUBLICATIONS

R. T. Morrison et al., *Organic Chemistry*, th Ed., Allyn & Bacon, Inc., 1983, pp. 1118–1119, 1125–1126, 1138–1144.
N. Sax et al., Ed., *Hawley's Condensed Chemical Dictionary*, 11th Ed., Van Nostrand, 1987, pp. 976–977.
Thin Solid Films, 99 (1983), pp. 283–290.
Electronics Letters, 7th Jun. 1984, vol. 20, No. 12, pp. 489–491.

Primary Examiner—Andrew J. James
Assistant Examiner—Sara W. Crane
Attorney, Agent, or Firm—Foley & Lardner, Schwartz, Jeffery, Schwaab, Mack, Blumenthal & Evans

[57] ABSTRACT

A light emitting element formed of a metal-insulator-semiconductor junction, the improvement wherein the insulator is a Langmuir-Blodgett film of an organic substance containing at least one of a synthetic protein and a natural protein. According to the element of this invention, stability of dynamic characteristics, luminescence efficiency and long-term stability can be significantly improved.

7 Claims, 1 Drawing Sheet

LIGHT EMITTING ELEMENT

BACKGROUND OF THE INVENTION

This invention relates to electrical light emitting elements, and more specifically to light emitting elements each of which is composed of a metal-insulator-semiconductor junction (hereinafter called "MIS junction") and has good stability in dynamic characteristics and excellent luminescence efficiency.

Electrical light emitting elements, especially, visible light emitting diodes (LED) have found wide spread commercial utility as functional display elements in various fields. Recently, researchers have also been started to apply them to printers and minifacsimiles.

These days LEDs which emit red light, yellow light, green light or the like employ, as their substrates, compound semiconductors of Group III-V elements of the periodic table such as Gap, GaAsP, GaAlAs. A dopant, for example, zinc, oxygen or nitrogen is suitably implanted in such substrates to form p-n junctions so as to make use of the light emission through recombination at the interfaces.

Such LEDs have already been commercially available, because of their high luminescence efficiencies of 0.2 to several percents.

However, in the case of LEDs capable of emitting blue light, where the compound semiconductors of Group II-VI are preferably employed, it is difficult to form p-n junctions as good as those of Group III-V since the semiconductors have wide band gaps.

Reflecting the above-mentioned difficulties, considerable research effort has been devoted to developing blue LEDs formed by MIS junctions, where a thin insulating layer is incorporated into metal and semiconductors such as zinc sulfide, zinc selenide or the like.

The minority carrier injections, in principle, are markedly improved by using MIS junctions.

However, the reliability of these light emitting elements composed of MIS structures is significantly poor when compared with the above-described red LEDs and the like.

One of the reasons for such lower reliability is ascribed to the extreme difficulty in preparing good insulating thin films on the compound semiconductors, in contrast with silicon semiconductor substrates, which have excellent insulating films of silicon oxide.

When fabricating a light emitting element based on an MIS junction, the following are essential requirements for the interposed insulating film.

First, the insulating film must have a thickness thin enough to provide the tunnel effect for electrons or holes and must also be homogeneous and uniform without structural defects, and the thickness must be controlled in the order of 100 Å of thinner. As a second requirement, no trap levels capable of capturing electrons and/or holes can exist in the film, the interface between the insulating film and metal layer or the interface between the insulating film and semiconductor substrate. Further, the insulating film must be free from deterioration when it is exposed to heat or a voltage of desired level.

In order to satisfy such requirements and to fabricate new electronic devices, it is attempted to deposit Langmuir-Blodgett films (hereinafter called "LB films") onto various semiconductor substrates by the Langmuir-Blodgett method (hereinafter called "LB method") and then to make use of the thus-applied LB films as insulating films. Thin organic films prepared by the LB method have attracted much attention compared with other film deposition methods such as evaporation, plasma polymerization and electrochemical deposition, since they have excellent film qualities and fulfill the above-described requirements. On the practical side, the selection of film-forming molecules in the LB method is of vital importance.

There are two reports on light emitting elements each of which makes use of the LB film as the insulating films of an MIS junction. One of the two reports is found in "Thin Solid Film", 99, 283 (1984).

This report deals with an MIS light emitting element with an LB film of cadmium stearate, one of the fatty acids, formed on an n-GaP semiconductor substrate. Since fatty acids are poor in mechanical strength, heat resistance and durability to applied voltages, they are not satisfactory for insulating films. However, their formation into LB films is easy and the thicknesses of the resulting LB films can be controlled on the order of the lengths of their molecules (in the case of stearic acid, about 25 Å per layer). The above-mentioned light emitting element makes use of an LB film of such a fatty acid, and its luminous efficiency increases as the film thickness becomes larger, reaching the maximum at a film thickness of 200 to 250 Å.

However, the above light emitting element is accompanied by drawbacks such as the fact that its light emitting characteristics are unstable and less durable, and are thus reduced even when operated for a short period of time.

The other report is found in "Electronics Letters" 20, (12), 489-491 (1984).

This report is directed to an MIS light emitting element with an LB film of a phthalocyanine derivative deposited on an n-GaP semiconductor substrate. The luminescence efficiency of this light emitting element reaches the maximum value of $8.6 \times 10^{-3}\%$ at the LB film thickness of 57 Å. The efficiency of the element is comparable to those of the above-mentioned elements composed of p-n junctions.

Moreover, this maximum luminescence efficiency is as good as that of MIS GaP LED having inorganic $SiO_2$ films of 40 Å thick as an insulating film.

Phthalocyanines applicable to the formation of the LB film have good thermal stability among various organic materials. Although the thermal and mechanical properties, in comparison with light emitting elements fabricated by using stearic acid, were improved, the thus-obtained light emitting element employing phthalocyanines still showed some undesired deterioration in the device characteristics during continuous operations. Hence, the proposed light-emitting element still involves many problems which have to be solved for its practical application.

For these reasons, there is an outstanding demand for the development of an insulating film which has fewer trap levels and still better characteristics from the viewpoint of stability with the passage of time, etc.

SUMMARY OF THE INVENTION

An object of this invention is to solve the above-described problems and to provide a light emitting element making use of an MIS junction which contains a novel LB film as an insulating film, especially, a blue light emitting element equipped with such an MIS junction.

The present inventors have carried out an extensive investigation of LB films useful as insulating films in light emitting elements making use of MIS junctions, particularly, of materials capable of forming such LB films. As a result, it has been found that the stability of dynamic characteristics, luminescence efficiency and long-term stability of light emitting elements can be significantly improved by using organic substances containing at least one of the synthetic proteins and natural proteins which will be described below. This finding has led to the development of light emitting elements of this invention.

Namely, each of the light emitting elements of this invention is a light emitting element formed by making use of an MIS junction, in which the insulator is a Langmuir-Blodgett film of an organic substance containing at least one of a synthetic protein and natural protein.

DESCRIPTION OF PREFERRED EMBODIMENTS

Figure 1:
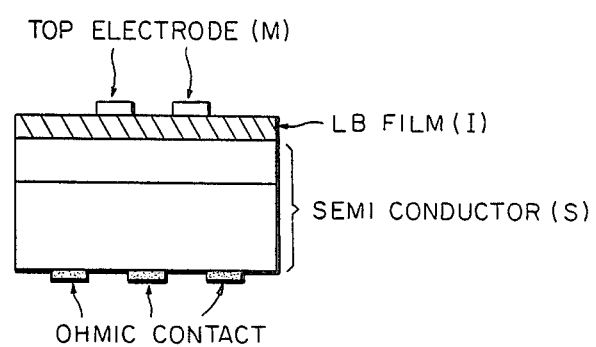
FIG. 1 is a cross-sectional view of the MIS light emitting element of the invention.

As the M, i.e., the metal in the light emitting element of this invention, may be mentioned a metal electrode having a small work function, for example, Al, Au, Mo, Cu or the like with Au being particularly suitable.

Next, the I, namely, the insulator is an LB film of an organic substance which contains as a principal component thereof, at least one of a synthetic protein and natural protein which will be described below.

Of these proteins, a substituted polypeptide represented by the below-given formula may be mentioned as a suitable example for the synthetic protein.

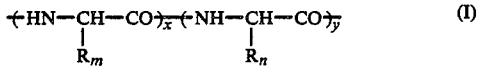

wherein $R_m$ and $R_n$ may be either the same or different and each represent a substituent residual group capable of yielding an α-amino acid, and x and y stand for the numbers of respective peptide bonds.

Any residual groups may be employed as the substituent residual groups in Formula (I) so long as they can yield α-amino acids. As exemplary substituent residual groups, may be mentioned a cysteine residual group, a thyroxine residual group, a tryptophane residual group, a tyrosine residual group, a threonine residual group, a histidine residual group, a phenylalanine residual group, a methionine residual group, a lysine residual group, a proline residual group, a leucine residual group, a glutamic acid residual group, an arginine residual group and a glutamine residual group.

These synthetic proteins can each be synthesized with ease by subjecting an amino acid or amino acids of different types to an acid-amide coupling reaction by a usual method (Foundation and Experiment for Peptide Synthesis, Izumiya, Kato, Aoyagi and Waki, January 1985, published by Maruzen). Here, the number of peptide bonds, in other words, the sum of (x+y) in the substituted polypeptide (I) may preferably be 20 or more because such a synthetic protein can provide light emitting elements having good resistance.

Illustrative of the natural protein are antibiotic polypeptides such as gramicidin-S and tyrocidin-S as well as phosphoproteins such as gelatin and casein. Of these natural proteins, the latter natural proteins have been known to undergo firm crosslinking when exposed to ultraviolet rays in the presence of photosensitizer such as ammonium dichromate and are preferably employed as negative photoresists in the fabrication of color filter. They are also useful in this invention as they can provide LB films having excellent mechanical strength and thermal resistance.

As other components, may for example be mentioned other film-forming molecules such as stearic acid, arachidic acid, behenic acid, vinyl stearate and the like. These other film-forming molecules are not always necessary because both the above-described synthetic proteins and natural proteins are by themselves well-balanced with respect to their hydrophobic and hydrophilic groups and they can thus make up accumulated LB films individually.

As the S, namely, the semiconductor in the light emitting element of this invention, may be mentioned compound semiconductors grown by various methods known per se in the art such as the Bridgeman method, vapor-phase epitaxy, liquid-phase epitaxy, etc., including gallium-phosphorus, gallium nitride, silicon carbide, zinc sulfide, zinc selenide and so on.

The light emitting elements of this invention can each be fabricated, by forming LB film, for example, in the following manner (See Shinzikken Kagagu Koza 18, Maruzen; G. L. Janes Jr., Insoluble monolayers as liquid-gas interfaces; Interscience, 1966).

First of all, a wafer substrate of one of the above-mentioned compound semiconductors is subjected to a surface cleaning treatment and is then placed in a LB-film forming apparatus.

While maintaining the aqueous subphase within prescribed pH, temperature and metal salt concentration ranges, a monomolecular film of an organic substance containing one of the above-mentioned proteins is caused to spread over the surface of the subphase.

Thereafter, while maintaining a predetermined surface pressure on the film surface, the known vertical dipping method or horizontal lifting method is applied a plurality of times until an accumulated LB film of a predetermined thickness is formed on the wafer substrate. The LB film is then thoroughly dried in an inert atmosphere such as nitrogen for instance and the wafer substrate with the thus-dried LB film applied thereto is immediately transferred to a vacuum deposition apparatus which is suitable for use in the formation of the upper electrodes, where a desired metal is deposited on the above-dried LB film through a deposition mask defining a suitable pattern so as to form an electrode.

In the manner mentioned above, a light emitting element composed of an MIS junction is obtained. (See FIG. 1.)

This invention will be described in detail below by referring to the following Examples, by which this invention is not limited.

EXAMPLE 1

An LB-film spreading solution was prepared by dissolving poly-L-phenylalanine (molecular weight: about 50,000) in a 1:5 mixture by volume of dichloroacetic acid and chloroform to a concentration of about 1 mg/ml. This synthetic protein is known to form a condensed film at 13 dyne/cm or higher from its isotherme plot (surface pressure vs. molecule-occupied area curve).

As an LB-film trough system, a commercial apparatus of the horizontal lifting type was used. Prior to spreading the above solution and forming an LB film, a cadmium(II) salt was added to a concentration of about 0.05 mM in the aqueous phase and the aqueous phase was maintained at pH 6.0 and at a temperature of 20° C.

An n-GaP wafer, which had been formed by vapor phase epitaxy, followed by its doping with N to a dopant concentration of about $1 \times 10^{18}$ atoms/cm$^3$ and had in advance been applied with an In-Ga backside electrode, was immersed in the above-prepared water phase.

Thereafter, about 600 μl of the LB-film spreading solution was spread by the Trurnit method and the resultant monomolecular film was stabilized while maintaining its surface pressure at 20 dyne/cm.

The wafer was pulled up at a speed of 70 μm/min. By repeating this procedure, an accumulated LB film consisting of five layers was formed.

After drying the wafer with the LB film accumulated thereon in a nitrogen atmosphere, gold was caused to deposit on the LB film by the vacuum deposition technique so that an upper electrode of about 200 Å thick was formed to provide an element making use of an MIS junction.

In the above element, the luminous peak was observed at 565 nm and stable current-voltage characteristics were also observed. Its luminescence efficiency was 2% at a forward bias of 5 V and a current level of 25 mA. Compared with conventional orange LEDs, the luminous efficiency was about 3 times. The initial efficiency was retained for about 5 days, thereby also demonstrating excellent stability with the passage of time.

EXAMPLE 2

A light emitting element was fabricated by forming a five-layered LB film of the Y-type in the same manner as in Example 1 except that the LB-film spreading solution was a solution obtained by mixing poly-im-benzyl-L-histidine (molecular weight: about 30,000) with stearic acid at a ratio of 1:1 (by weight) and then dissolving the resultant mixture in a 1:5 (by volume) mixed solution of dichloroacetic acid and chloroform to a concentration of 0.7 mg/ml and the semiconductor substrate was a zinc selenide wafer doped with about 50 ppm of Al.

In the above element, the luminous peak was observed at 465 nm and stable current-voltage characteristics were also observed. Its luminous efficiency was 0.3% at an impressed voltage of 5 V and a current level of 20 mA. Compared with conventional blue LEDs, the luminescence efficiency was about 5 times. The initial efficiency was retained for about 4 days, thereby also demonstrating excellent stability along the passage of time.

As apparent from the above description, use of LB films of this invention as insulating films in light emitting elements making use of MIS junctions can provide light emitting elements which have resistance far superior to conventional light emitting elements, which exhibit stable luminous characteristics owing to the superior resistance coupled with their lower interfacial energy levels in the contact regions with the corresponding semiconductor substrates, and which assure significantly-improved luminous efficiencies. Hence the light emitting elements of this invention have solved the drawbacks observed with conventional light emitting elements making use of MIS junctions, namely, the instability in their dynamic characteristics, and have brought about improved and stabilized luminous efficiencies. This invention therefore has an extremely large industrial value.

We claim:

1. A light emitting element comprising a metal-insulator-semiconductor junction wherein the insulator is a Langmuir-Blodgett film of an organic substance containing a synthetic protein represented by the following formula:

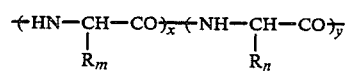

wherein $R_m$ and $R_n$ may be the same or different and each represent a substituent residual group capable of yielding phenylalanine, and x and y stand for the numbers of respective peptide bonds, the total number of peptide bonds being 20 or more.

2. A light emitting element comprising a metal-insulator-semiconductor junction wherein the insulator is a Langmuir-Blodgett film of an organic substance containing film-forming molecules and at least one of a synthetic protein and a natural protein wherein the synthetic protein is a substituted polypeptide represented by the following formula:

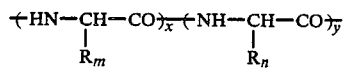

wherein $R_m$ and $R_n$ may be the same or different and each represent a substituent residual group capable of yielding an α-amino acid selected from the group consisting of cystine, thyroxine, tryptophane, tyrosine, threonine, histidine, phenylalanine, methionine, lysine, proline, leucine, glutamic acid, arginine, and glutamine, and x and y stand for the numbers of respective peptide bonds, the total number of peptide bonds being 20 or more.

3. The light emitting element according to claim 2, wherein said natural protein is an antibiotic polypeptide or a phosphoprotein.

4. The light emitting element according to claim 3, wherein said antibiotic polypeptide is gramicidin-S or tyrocidin-S, and said phosphoprotein is gelatin or casein.

5. The light emitting element according to claim 2, wherein said film-forming molecules are selected from the group consisting of stearic acid, arachinic acid, behenic acid and vinyl stearate.

6. The light emitting element according to claim 2 wherein the a-amino acid is selected from the group consisting of histidine, phenylalanine, proline and leucine.

7. The light emitting element according to claim 2 wherein the a-amino acid is selected from the group consisting of histidine and phenylalanine.

* * * * *